United States Patent [19]

Lanfranca

[11] Patent Number: 4,811,300
[45] Date of Patent: Mar. 7, 1989

[54] MEMORY DEVICE HAVING A SIMPLIFIED SENSE AMPLIFIER WITH A BUFFER CONDUCTIVE DURING BOTH PRECHARGE AND READ OPERATIONS

[75] Inventor: Michel Lanfranca, Paris, France

[73] Assignee: U.S. Philips Corporation, New York, N.Y.

[21] Appl. No.: 26,239

[22] Filed: Mar. 16, 1987

[51] Int. Cl.[4] .................................................. G11C 7/00
[52] U.S. Cl. .................................... 365/203; 365/190; 365/189
[58] Field of Search ............... 365/189, 205, 203, 190, 365/189, 184, 154, 230; 307/481

[56] References Cited

U.S. PATENT DOCUMENTS

| | | | |
|---|---|---|---|
| 4,062,000 | 12/1977 | Donnelly | 365/203 X |
| 4,395,765 | 7/1983 | Moffitt et al. | 365/203 |
| 4,667,310 | 5/1987 | Takada | 365/190 |

Primary Examiner—Stuart N. Hecker
Assistant Examiner—Alfonso Garcia
Attorney, Agent, or Firm—Steven R. Biren

[57] ABSTRACT

A memory includes a sense amplifier with a buffer (TA) positioned at the end of each bit line, the buffer amplifier being alternatively used as a "sense amplifier". On the bit line Q the buffer amplifier includes only five transistors; the transmission transistor TR ("passing transistor") is activated during the read operation RD, and also during the precharging operation PCH; as a result thereof the output signal S always has zero value during the precharging operation. The parasitic capacitance CS is small relative to the equivalent capacitance CB of the bit line Q, and the supporting inverter SI is small with respect to the amplifying inverter PI.

2 Claims, 1 Drawing Sheet

MEMORY DEVICE HAVING A SIMPLIFIED SENSE AMPLIFIER WITH A BUFFER CONDUCTIVE DURING BOTH PRECHARGE AND READ OPERATIONS

BACKGROUND OF THE INVENTION

The present invention relates to a memory comprising an array of memory cells each storing a bit to be read, with read means which are responsive to a read control signal, an array of bit lines each provided with precharging means for being precharged in response to a precharge control signal and, located at tee end of each bit line, a read buffer amplifier controllable by a transmission transistor for producing on an output line, an amplified stable signal which is representative of the value of a bit read.

This type of memory is well known and is frequently used in the electronics and information processing industries.

A known example of such a memory is disclosed in the publication "IEEE International Solid-State Circuits Conference, Feb. 12th 1982, IEEE, New York (US) S. Konishi—A 64 Kb CMOS—RAM, pages 258–259". Another known example is shown in FIG. 2 of U.S. Pat. No. 4,003,034.

Substantially all types of memories, random-access memories, read-only memories etc . . . , are realized in the form of a matrix of bit cells, each cell being positioned at the intersection of a column and a row; during a read operation one signal cell of each row is read and the information is transmitted to a bit line which is used in common by all the cells of the same row; the actual read arrangement, here denoted read sense amplifier, is arranged at the end of each bit line; the present invention relates more specifically to the read sense amplifier.

In prior art memories, more specifically those implemented in MOS technology, the sense amplifier with buffer generally comprises an amplifier ("sense amplifier"), a transmission transistor ("passing transistor") responsive to the read control signal, and a buffer ("latch"); it consequently includes at least eight transistors; the present invention has for its object to reduce this number of transistors.

SUMMARY OF THE INVENTION

A memory- according to the present invention is more specifically characterized in that the read buffer amplifier comprises firstly said transmission transistor, a first electrode of which is connected to said bit line, secondly a first inverter connected between the second electrode of the transmission transistor and said output line, thirdly, a second inverter connected in a head-to-tail configuration to said first inverter, and in that on the one hand the gate of said transmission transistor is connected not only to said read control but also to said precharging control so as to provide that said transmission transistor will be conductive not only during the reading operation, but also during the precharging operation, and on the other hand this second inverter is weak compared with the first inverter.

Thus, the amplifier with buffer has only five transistors, which is advantageous since presently the highest degree of integration in the field of integrated circuits is aimed at and this reduction in the number of transistors is effected for each bit line of the memory; in certain types of memory there are up to 4 bit lines per row; thus the savings in space, measured in mm² of the substrate area, is considerable.

In an advantageous embodiment, knowing that each bit has a comparatively important equivalent capacitance, the invention is characterized in that a parasitic capacitance present at the input of the buffer amplifier is relatively weak compared with said equivalent capacity of the bit line.

Thus, during a read operation, the discharge time will be shorter the more so as the capacitance is lower; this characteristic has for its object to reduce the overall read time.

BRIEF DESCRIPTION OF THE DRAWING

The invention and how it can be put into effect will be better understood from the following description given, by way of non-limitative example, with reference to the accompanying drawings, in which.

DESCRIPTION OF THE PREFERRED EMBODIMENT

Figure 1:
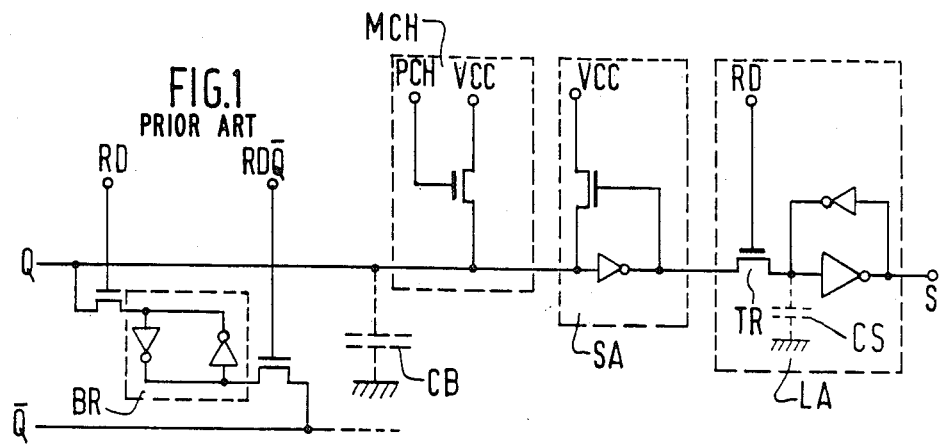
FIG. 1 shows a bit line of the prior art RAM memory.

FIG. 1 shows a known memory cell BR which is accessible by two transistors one of which is controlled by the read control signal RD to transfer the information read on the bit line Q, the other one being controlled by the read control signal RD Q to transfer the information read on the complementary bit line Q; the other cells of the memory of the same row, not shown here, are connected in a similar way to the two bit lines Q and Q; in certain types of memories there are up to four bit lines per row as is described in the U.S. Pat. No. 4,395,765; the number of rows depends of course on the capacity of the memory; the FIG. 1 shows a detailed representation of one single bit line, the other bit lines are similar thereto.

The bit line Q is provided with known precharging means MCH for precharging the bit line under the control of a precharging control signal PCH; as a reminder, the equivalent capacitance CB of the bit line is here shown symbolically, it being a capacitance which is predominantly determined by the length of the bit line; the circuit SA is an amplifier-selector ("Sense Amplifier") and the circuit LA is a buffer ("Latch") whose transmission transistor TR ("passing transistor") is responsive to the read control signal RD, CS being a parasitic capacitance at the input of the buffer; knowing that each inverter is formed by two transistors, it is apparent that the two circuits (SA+LA) which constitute a read buffer amplifier arranged at the end of the bit line, includes eight transistors; the output signal which is a stable and amplified signal, is available at the end of the read operation on the output line S.

Figure 2:
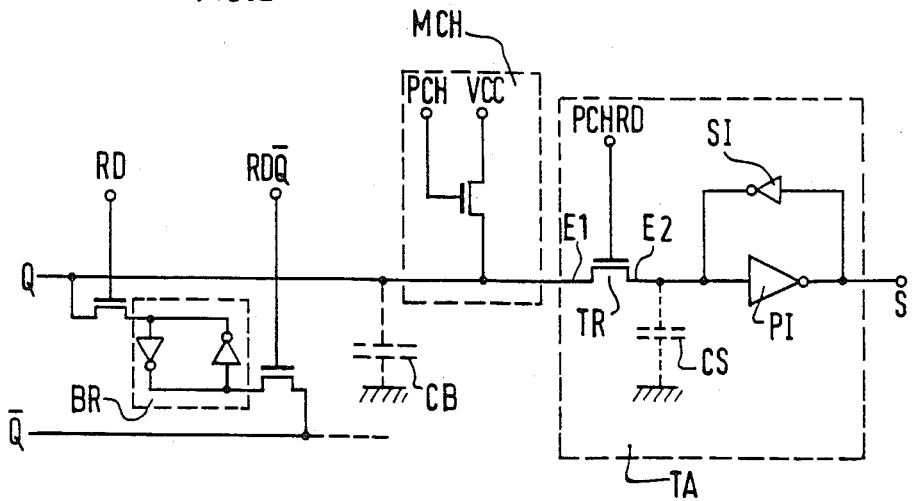
FIG. 2 shows a bit line of the RAM memory according to the invention.

FIG. 2 shows a buffer amplifier TA according to the invention, placed at the end of the bit line Q; the other elements, which are unchanged relative to FIG. 1, are shown in an identical way and with the same references.

The transmission transistor TR, a first electrode E1 of which is connected to the bit line, is now controlled via its gate by the control signal PCHRD which is not only active during the presence of said read control signal RD but also during the presence of precharge control signal PCH; a first inverter PI is connected between the second electrode E2 and the output line S; a second inverter SI is connected in a head-to-tail configuration to the first inverter PI; the capacitance CS is a parasitic capacitance representing the capacitance at the input of the buffer SI/PI; the second inverter is weak compared with the first inverter.

The circuit operates as follows: during the precharging operation, the control of PCH being in the active state, the bit line Q is precharged, as is also the parasitic capacitance CS, since the transmission transistor TR is conductive; the high signal thus present at the electrode E2 is inverted by the inverter PI and the output line S carries a low signal; during reading two situations may occur depending on the content of the memory cell: (a) if the bit line Q preserves the value 1, the values established during the precharging operation remain unchanged and the output line preserves its low level; (b) if the bit line Q is pulled to zero, the two capacitances CB and CS progressively discharge until the inverter PI changes state to produce, in this case, a high level on the output line. To enable the inverter PI to change state, it will be apparent that the inverter SI must be weak to prevent it from opposing the discharging of the capacitance during reading; on the other hand, after reading, when the transmission transistor TR is not conductive, the inverter SI must be adequate to compensate for any unwanted change of state, more specifically for the discharge of the parasitic capacitance; otherwise discharging would in the long run be inevitable because of the leakage currents To ensure that the read rate is adequately high, it is apparent that the parasitic capacitance CS must be relatively low compared with the equivalent capacity CB of the bit line. The buffer amplifier thus realized has only five transistors; in addition, the two transistors of the inverter SI are small transistors; the result is a significant gain in substrate surface area.

By way of practical example, in an embodiment according to the invention, the equivalent capacitance CB has substantially a value of $10^{-12}$ farad while the parasitic capacitance CS has a value of the order of $10^{-13}$ to $5.10^{-14}$ farad; moreover, the inverter PI has a power which is 20 to 40 times greater than the power of the inverter SI; these values which are given by way of indication are definitely not limitative.

The present invention relates to any type of memory: random-access memories, read-only memories, or any other type; the electrical characteristics of the various components of the buffer amplifier are more specifically a function of the capacity of the memory, and also of the power required on the output line S.

It should be noted that the output signal is always reset to zero during the precharging phase, consequently this signal is not valid during this precharging phase; this is not a disadvantage as, in the majority of cases, the arrangements connected to the output of the memory are only activated at the end of the read operation.

What is claimed is:

1. A memory comprising at least one memory cell for storing a bit to be read, with read means which are responsive to a read control signal, at least one bit line provided with precharging means for being precharged in response to a precharge control signal, and, located at the termination of each said bit line, a transmission transistor and a read buffer amplifier, controllable by said transmission transistor for producing, on an output line, an amplified stable signal which is representative of the value of a bit read, characterized in that the read buffer amplifier comprises said transmission transistor, a first electrode of which is connected to said bit line, a first inverter connected between a second electrode of the transmission transistor and said output line, a second inverter connected in a head-to-tail configuration to said first inverter, and in that a gate of said transmission transistor is connected to said read control signal and to said precharging control signal so that said transmission transistor will be conductive during the reading operation and during the precharging operation, said second inverter having smaller transistors than those of the first inverter.

2. A memory as claimed in claim 1, each bit line having an equivalent capacitance, characterized in that a parasitic capacitance present at the input of the buffer amplifier is smaller than the equivalent capacitance of the bit line.

* * * * *